(12) United States Patent
Cromwell

(10) Patent No.: US 7,323,358 B1
(45) Date of Patent: Jan. 29, 2008

(54) METHOD AND SYSTEM FOR SIZING A LOAD PLATE

(75) Inventor: Stephen Daniel Cromwell, Penryn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 292 days.

(21) Appl. No.: 10/639,853

(22) Filed: Aug. 13, 2003

(51) Int. Cl.
| H01L 23/02 | (2006.01) |
| H01L 23/12 | (2006.01) |
| H01L 23/34 | (2006.01) |
| H01L 21/00 | (2006.01) |

(52) U.S. Cl. ............ 438/106; 438/125; 257/678; 257/704; 257/718

(58) Field of Classification Search .............. None
See application file for complete search history.

(56) References Cited

U.S. PATENT DOCUMENTS

| 4,958,970 | A | * | 9/1990 | Rose et al. ............... 411/12 |
| 5,276,585 | A | * | 1/1994 | Smithers ............... 361/704 |
| 5,399,317 | A | * | 3/1995 | Stolowitz .............. 422/99 |
| 5,709,514 | A | * | 1/1998 | Suggs et al. ........... 411/150 |
| 5,741,141 | A | * | 4/1998 | O'Malley .............. 439/73 |
| 5,760,986 | A | * | 6/1998 | Morehouse et al. ..... 360/67 |
| 5,829,933 | A | * | 11/1998 | Kramer ............... 411/156 |
| 5,835,303 | A | * | 11/1998 | Morehouse et al. ..... 360/97.01 |
| 6,040,532 | A | * | 3/2000 | Munch ................ 177/144 |
| 6,049,456 | A | * | 4/2000 | Messina et al. ......... 361/704 |
| 6,091,179 | A | * | 7/2000 | Tobe et al. ............ 310/328 |
| 6,134,112 | A | * | 10/2000 | LeCornu et al. ........ 361/720 |
| 6,198,630 | B1 | * | 3/2001 | Cromwell ............. 361/704 |
| 6,287,892 | B1 | | 9/2001 | Takahashi et al. |
| 6,386,890 | B1 | * | 5/2002 | Bhatt et al. ........... 439/67 |
| 6,459,582 | B1 | * | 10/2002 | Ali et al. ............. 361/704 |
| 6,477,058 | B1 | | 11/2002 | Luebs et al. |
| 6,545,352 | B1 | * | 4/2003 | Ruckdeschel .......... 257/718 |
| 6,574,028 | B2 | | 6/2003 | Esener et al. |
| 6,884,943 | B1 | * | 4/2005 | Gonzalez et al. ........ 174/260 |
| 2002/0070448 | A1 | * | 6/2002 | Gonzalez et al. ........ 257/727 |
| 2003/0014728 | A1 | * | 1/2003 | Shaeffer et al. ......... 716/15 |
| 2003/0224557 | A1 | * | 12/2003 | Cromwell ............. 438/118 |
| 2004/0038583 | A1 | * | 2/2004 | Peterson et al. ........ 438/485 |
| 2004/0086793 | A1 | * | 5/2004 | Sreenivasan et al. ..... 430/22 |
| 2004/0089937 | A1 | * | 5/2004 | Hensley et al. ........ 257/688 |
| 2004/0118584 | A1 | * | 6/2004 | Franz et al. ........... 174/52.1 |
| 2004/0247925 | A1 | * | 12/2004 | Cromwell ............. 428/548 |
| 2005/0001310 | A1 | * | 1/2005 | Dai et al. ............. 257/704 |
| 2005/0007748 | A1 | * | 1/2005 | Callahan et al. ........ 361/809 |

* cited by examiner

*Primary Examiner*—Carl Whitehead, Jr.
*Assistant Examiner*—James M Mitchell

(57) ABSTRACT

A method of sizing a load plate for an Application Specific Integrated Circuit (ASIC) assembly includes compressing the load plate prior to installation in the ASIC assembly. The compression is adjusted to cause the load plate to provide a target load when installed in the ASIC assembly.

22 Claims, 4 Drawing Sheets

METHOD AND SYSTEM FOR SIZING A LOAD PLATE

BACKGROUND

An Application-Specific Integrated Circuit (ASIC) is a microchip designed for a special application. The ASIC is designed to process information or complete tasks in a manner specific to the intended application. For example, ASICs are used in such diverse applications as auto emission control, environmental monitoring, and personal digital assistants (PDAs). ASICs are contrasted with general integrated circuits that can be used to perform different tasks for different applications. Examples of general integrated circuits include the microprocessor and the random access memory chips in a typical personal computer.

An ASIC can be mass-produced for a special application or can be custom manufactured for a particular customer application. Custom production is typically performed using components from a "building block" library of ASIC components. Each ASIC includes a number of input/output (I/O) leads that allow the ASIC to be connected to a larger circuit and receive the signals and data with which the ASIC works. These I/O leads are typically arranged in an array known as a Land Grid Array (LGA). The ASIC is usually attached to a circuit board, such as a printed circuit board (PCB). Leads or a socket on the circuit board make contact with the I/O leads of the LGA and connect the ASIC to the larger circuit of which it is a part.

The ever growing I/O count in today's large ASICs requires a very high clamping load to secure the ASIC to the circuit board and ensure continuous electrical contact between the ASIC and the circuit on the PCB. Clamping loads in the range of 400 to 700 pounds are becoming common. As noted, a socket may be provided on the PCB into which the ASIC is clamped.

The load necessary to secure the ASIC to the PCB is produced by the hardware used to attach the ASIC to the circuit board. This hardware is frequently referred to as the "attach hardware" or "attach hardware assembly." The attach hardware includes a bolster plate and a load plate. The load plate is a rigid, curved plate that is typically made of steel and is sometimes referred to as a spring plate. The bolster plate is similar, but is not curved and much thicker.

The ASIC assembly is sandwiched between the load plate and the bolster plate. Load studs connect the load plate and bolster plate, and a load screw is tightened to push the load plate and bolster plate apart causing the load plate to flex and generate the desired clamping force to the ASIC and circuit board.

Because the clamping load required is so high, the force can also cause the PCB and/or the bolster plate to bow or deflect. This results in a non-uniform contact compression resulting in a high resistance or open connection. Consequently, any bow of the bolster plate must be minimized. In some applications, this requires minimizing the load applied. On the other hand, the socket or connection between the ASIC and PCB requires a certain minimum load to be reliable. The result is that the load must be sufficient to provide a reliable connection in the socket or between the ASIC and PCB, but must not be strong enough to cause a significant bow in the bolster plate or circuit board.

Consequently, the applied load should remain within a narrow optimal range so that the tolerance or variation in the load applied by different load plates in different assemblies should be minimized to provide a consistent and optimal product.

SUMMARY

A method of sizing a load plate for an Application Specific Integrated Circuit (ASIC) assembly includes compressing the load plate prior to installation in the ASIC assembly. The compression is adjusted to cause the load plate to provide a target load when installed in the ASIC assembly.

BRIEF DESCRIPTION OF THE DRAWINGS

The accompanying drawings illustrate various embodiments of the present invention and are a part of the specification. The illustrated embodiments are merely examples of the present invention and do not limit the scope of the invention.

Throughout the drawings, identical reference numbers designate similar, but not necessarily identical, elements.

DETAILED DESCRIPTION

The present specification describes a method and system of sizing a load plate of an attach hardware assembly to control the range of the load applied by that load plate in an ASIC assembly. This "sizing" of a load plate is done by compressing the curved load plate to a specific height beyond the compression the load plate would experience when in use in an attach hardware assembly.

The first time a load plate is compressed, the compression will cause the load plate to plastically and permanently deform its curvature. The height of the plate and load that the plate delivers under a given set of conditions are changed by this plastic deformation of the plate. Thus, the load provided by the deformed plate thereafter may be different than was intended by the plate's design and outside the optimal load range.

The sizing process, as described herein, includes compressing a load plate prior to the plate being placed in service. This compression allows the load plate to plastically deform prior to its first use in service so that the load applied by the plate thereafter, i.e., after the plate is placed in service, will be consistent. The sizing process can also be used to fine tune the load the plate will deliver when placed in service. By sizing each run of load plates, depending on a sample compression of those load plates, the variation or tolerance of the load applied by the load plates when in use can be minimized or eliminated to result in a more consistent and optimal product.

Figure 1:
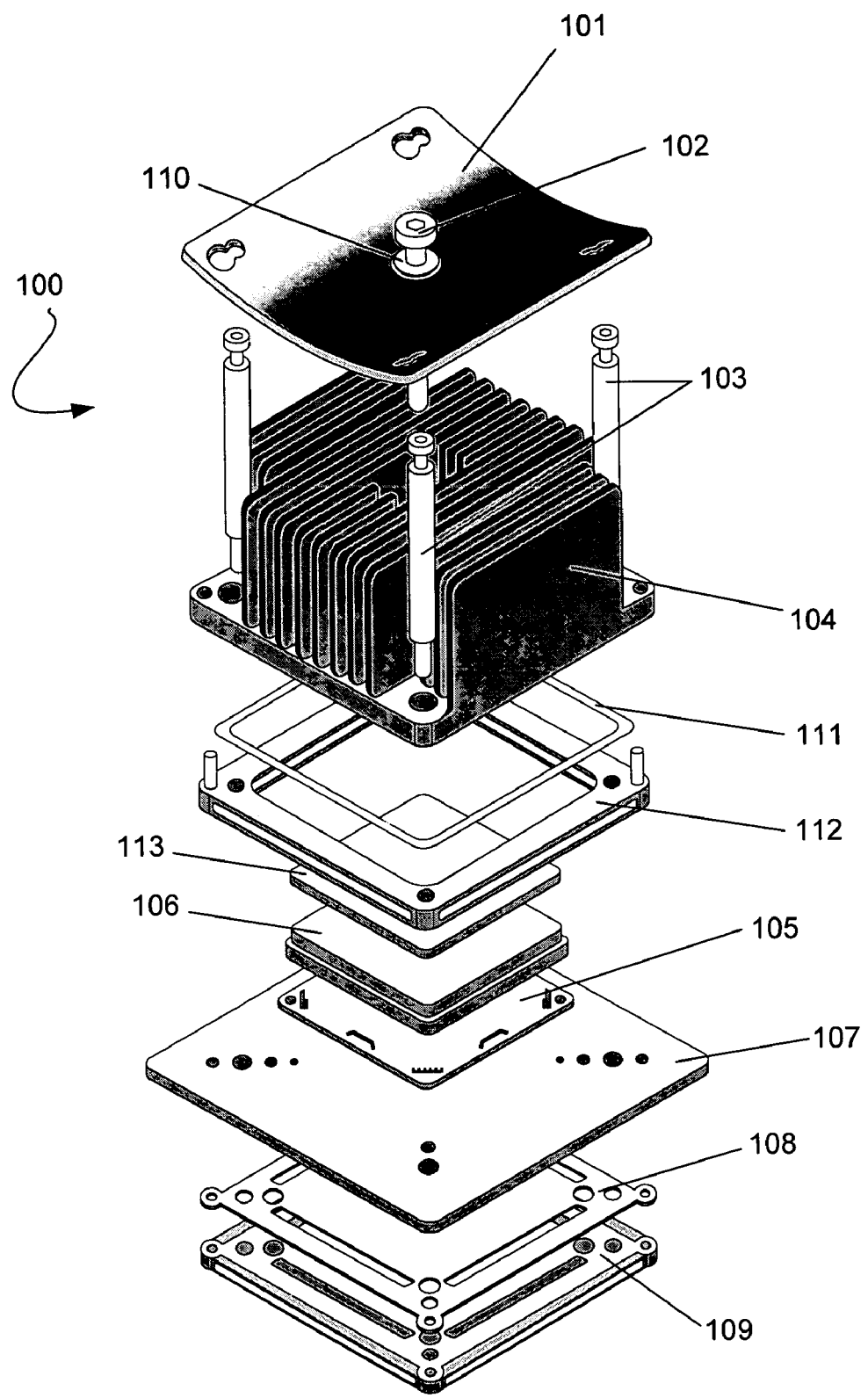
FIG. 1 is an exploded view of an ASIC assembly including an attach hardware assembly designed to provide a desired load according to an embodiment of the present invention.

FIG. 1 illustrates an ASIC assembly (100) with attach hardware. As shown in FIG. 1, a typical ASIC assembly includes an ASIC (106) that is electrically connected to a circuit board (107), for example a printed circuit board. Typically, the ASIC (106) is connected to the circuit board (107) using a socket (105). An insulator (108) is disposed below the circuit board (107) to insulate the circuit board (107) from the attach hardware assembly which will be described below.

A heat sink (104) is typically included in the assembly to dissipate heat generated by the ASIC (106). An ASIC (106)

will typically generate heat as it operates. If this heat is not dissipated, it can cause damage to the ASIC (106) or other components of the assembly (100). A thermal interface material (113) is positioned between the heat sink (104) and the ASIC (106) to enhance the thermal interface and improve thermal conduction between the two. An Electro Magnetic Interference (EMI) gasket (111) and EMI frame (112) are also positioned between the heat sink (104) and the circuit board (107).

As described above, the ASIC (106) and circuit board (107) are held together with an assembly of attach hardware. Among other things, the attach hardware includes a load plate (101) and a bolster plate (109). Load studs (103) are also part of the attach hardware and run between the load plate (101) and the bolster plate (109).

Another component of the attach hardware is a load screw (102). The load screw (102) is designed to push against the heat sink (104) to provide an upward force on the load plate (101). This force deflects the curved load plate (101) to generate the desired load to the ASIC assembly components.

The circuit board (107), the socket (105), the ASIC (106) and the thermal interface material (113) are sandwiched between the bolster plate (109) and the heat sink (104). A washer (110), which will be described in more detail below can also be used to control or limit the range of load that the attach hardware assembly applies. As shown in FIG. 1, the heat sink (104), ASIC (106), socket (105), circuit board (107) and insulator (108) are all sandwiched between the load plate (101) and the bolster plate (109) to complete the ASIC assembly (100).

Assembly of the ASIC assembly (100) is performed as follows. The bolster plate (109) and EMI Frame (112) are attached to the circuit board (107) via the load studs (103). The socket (105) and ASIC (106) are placed onto the circuit board (107). Then, the heatsink (104) is lowered down onto the ASIC (106) over the load studs (103). The load plate assembly (101, 102) is shuttled onto the load studs (103) and the load screw (102) is turned until the gap between the washer (110) and the screw head is closed.

Figure 2:
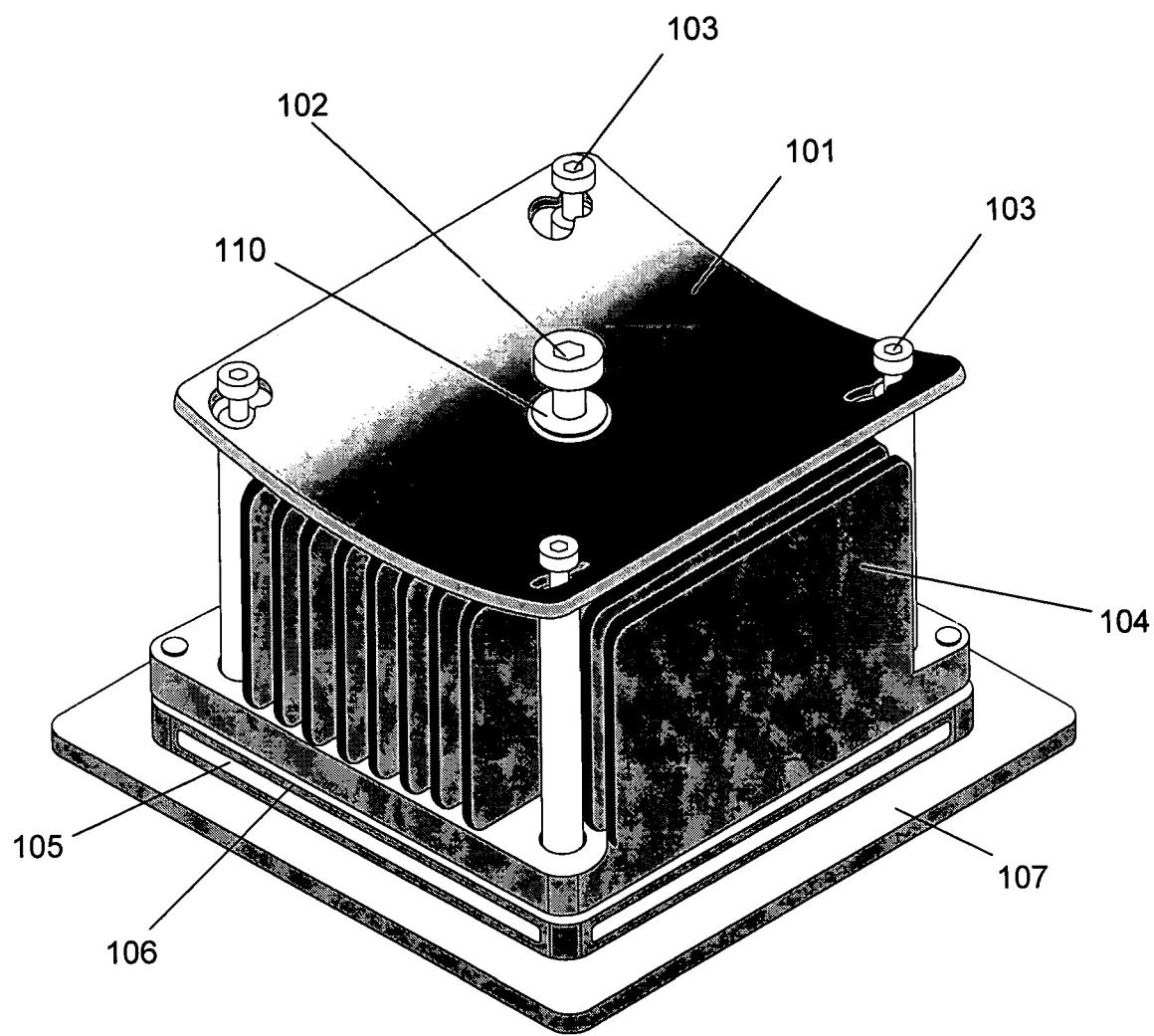
FIG. 2 is an illustration of the ASIC assembly of FIG. 1 when fully assembled.

The assembled unit is illustrated in FIG. 2. However, in FIG. 2, the load screw (102) is not fully inserted.

When the load screw (102) is tightened, the end of the screw (102) driven against the heat sink (104). Because the heat sink (104) does not accept the screw (104), the force of the screw (102) against the heat sink (104) creates an upward force on the load plate (101), particularly at the center of the load plate (101) through which the screw (102) is threaded. This force pushes upward on the center of the load plate (101) deflecting or decreasing the curvature of the load plate while the corners of the load plate (101) are held in place by the load studs (103).

The final load applied is a function of the z-axis tolerance loop of the components and the material variations that impact the spring rate of the load plate (101). The component tolerances can be managed by careful design and specification, but cannot be eliminated. In this particular design, that tolerance is, for example, +/−0.022". For high load designs (e.g., 550 lbs of load) with large spring rates (e.g., about 2500 lbs/in), the resulting load tolerance due to component z-axis tolerances can be large (e.g., +/−55 lbs). The load tolerance due to spring rate variation of the load plate can be even higher. This variation is most strongly a function of the plate (101) material thickness tolerance. In the embodiment shown, the load plate (101) is comprised of two stacked plates that are 0.048" thick with a thickness tolerance of +/−0.002" each. This results in a +/−68 lb load tolerance.

Figure 3A:
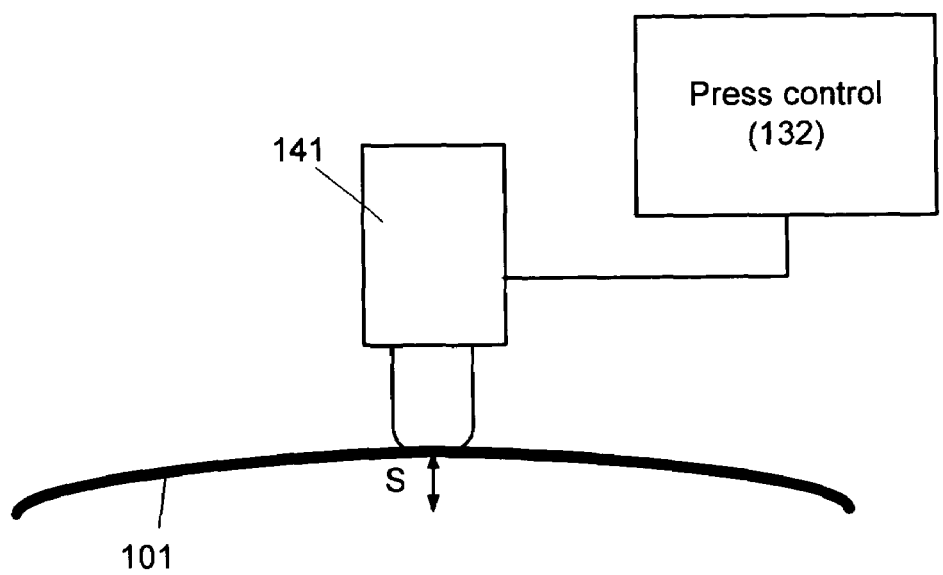
FIGS. 3a and 3b illustrate a system for sizing a load plate.
Figure 3B:
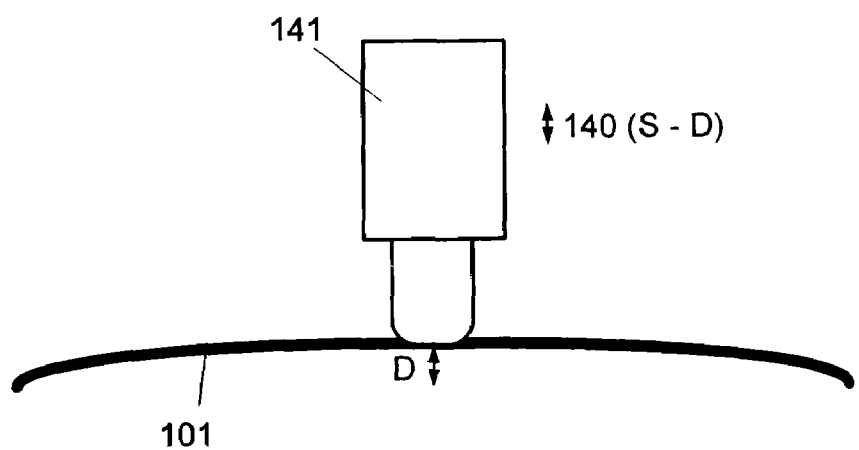

The sizing process described herein seeks to minimize or eliminate variations in load due to the variations in plate thickness. As shown in FIGS. 3*a* and 3*b*, the load plate is sized or compression to a specified height beyond the compression the load plate will experience when in use in an attach hardware assembly. This ensures that the force required to deflect the load plate and the resulting load is repeatable and consistent each time the load plate is deflected.

The sizing process causes the load plate to plastically deform, thereby changing the amount of deflection that the load plate will experience when in use. The greater the sizing stroke, the flatter the load plate and the smaller the resulting deflection of the load plate when in use. Less deflection results in less load.

The sizing process changes the spring rate of the load plate. The greater the sizing stroke, the lower the resulting spring rate. The design intent of the plate is to reach the target or desired load at a nominal installed deflection.

FIGS. 3*a* and 3*b* illustrate the system used to perform this sizing process. As shown in FIG. 3*a*, the load plate (101) has a curvature. The curvature gives the load plate (101) a height (S). To size the load plate (101), as described herein, a press (141) is applied to compress or flatten the curved load plate (101).

As shown in FIG. 3*b*, the press (141) has applied a force to compress the load plate (101). Consequently, the height of the load plate is decreased to a compressed height (D).

The sizing stroke (140) is the difference between the uncompress height (S) of the load plate (101) and the compressed height (D) of the load plate (101). The magnitude of the sizing stroke may vary as will be described below. In general, the sizing stroke will deflect the curvature of the load plate (101) more than the load plate (101) will deflect when in use in an ASIC assembly.

As shown in FIG. 3*a*, a press control (132) controls the press (141) to provide a desired compression to the load plate (101). The press control (132) can control the press (141) to deliver a variety of different compressions to load plates being pressed. The press control (132) can also control the press (141) to deliver a consistent compression to a run of load plates being processed.

Figure 4:
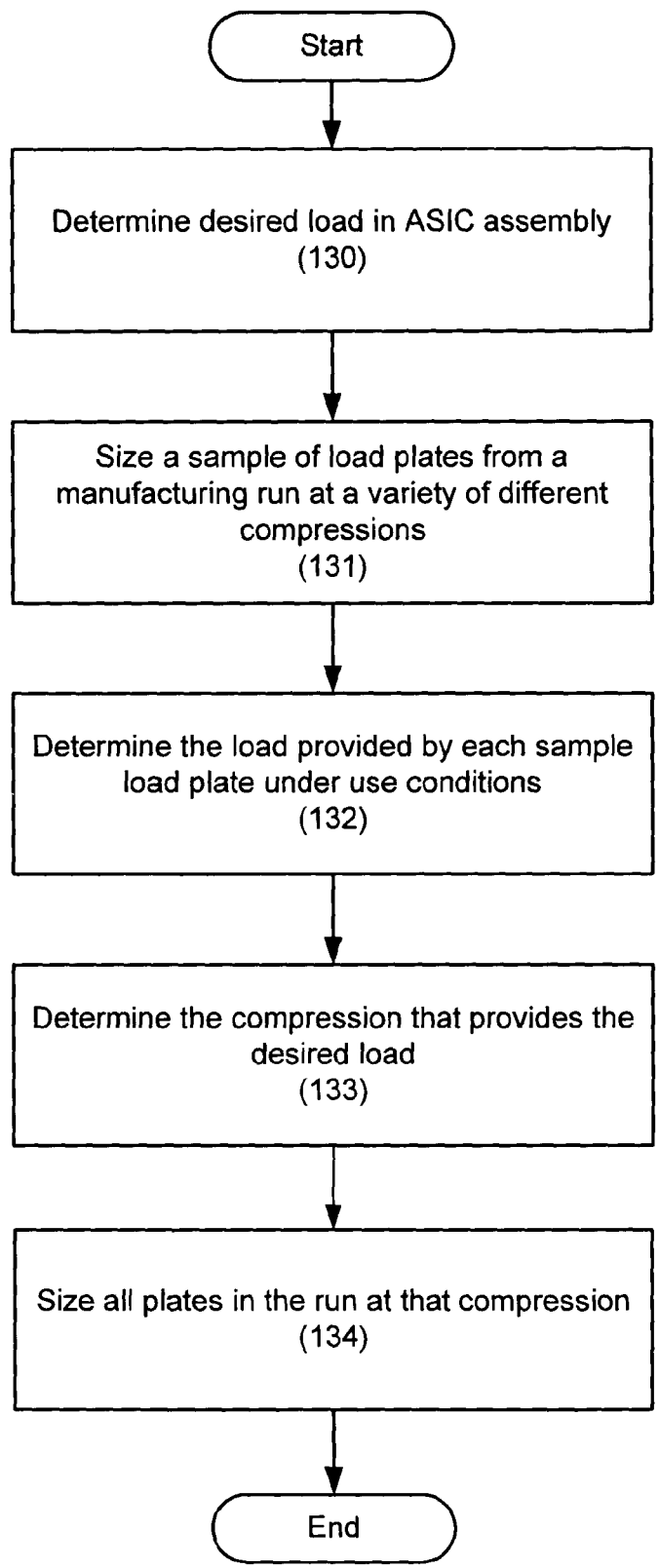
FIG. 4 is a flowchart illustrating a method of sizing a load plate.

FIG. 4 is a flow chart illustrating a method of sizing load plates according to the principles described herein. As shown in FIG. 4, the sizing process is generally repeated for each run of load plates being made. A "run" is defined as a batch of load plates made from single batch of raw material.

As shown in FIG. 4, it is first determined what the optimal range or desired load is for the load plate to apply to the ASIC assembly (step 130). When the desired load is established, load plates can be sized accordingly.

A the end of the manufacturing process, when a run of load plates have been created from a common lot of raw material, a number of the plates are taken as a sample. This sample of load plates is then compressed at a variety of different compressions (step 131) using, for example, the press system illustrated in FIGS. 3*a* and 3*b*.

The sample of compressed plates are then tested to see what load each plate will provide under the conditions in which a plate will be used in an ASIC assembly (step 132). Plates that have been exposed to a different compression, i.e., a different sizing stroke, will provide slightly different loads.

Next, we determine which of the sample plates provides the desired or target load when tested under plate use conditions (step 133). The compression used to size that plate is then used to size all the remaining plates in the run (step 134).

Consequently, the sizing process helps cause the plate to provide the same load when compressed in actual use by accounting for any plastic deformation that will occur. The sizing process also helps minimize or eliminate variation in the load provided by plates from different production runs. The plate is specified and built per its function, rather than its geometry.

Another advantage of the sizing process described herein is that is allows the use of standard stock material in the production of load plates as opposed to special material rolled to tighter thickness tolerances. Standard stock material is cheaper and more widely available. Specially toleranced material has to be ordered in mill run quantities and, as a result, has a large minimum order quantity and a large required lead-time. The sizing process also enables the manufacturer to easily monitor the function of the plates being produced at regular intervals.

Additionally, in prior designs, the load screw (102) was turned until it came to a stop against the load plate (101). This results in the stack and spring rate tolerances being combined to result in very high load tolerances (e.g., +/−123 lbs).

In order to eliminate or vastly reduce this tolerance, the thickness of the load washer (110) can be adjusted in the load plate assembly (101, 102 and 110) to compensate for the variation in spring rate due to material thickness tolerance in the load plate (101). The load plate (101) is characterized or measured and a washer (110) of the appropriate thickness is placed in the assembly so that the resulting load plate deflection once installed in the assembly results in the target load.

The appropriate thickness for the washer (110) may be determined for each unit. Alternatively, the thickness of the washer (110) may be adjusted only when a new lot of material is introduced for forming load plates (101). This is because the material thickness doesn't vary much within a run of material.

The preceding description has been presented only to illustrate and describe embodiments of invention. It is not intended to be exhaustive or to limit the invention to any precise form disclosed. Many modifications and variations are possible in light of the above teaching. It is intended that the scope of the invention be defined by the following claims.

What is claimed is:

1. A method of adjusting a load delivered by a load plate for an Application Specific Integrated Circuit (ASIC) assembly, said method comprising:
   providing said load plate formed with a curvature; and
   after providing said load plate with said curvature, compressing said load plate prior to installing said load plate in said ASIC assembly, said compressing being adjusted to plastically and permanently deform said curvature with which said load plate was originally formed to cause said load plate to provide a target load when installed in said ASIC assembly; and installing the plate in said ASIC assembly.

2. The method of claim 1, further comprising determining said target load prior to compressing said load plate.

3. The method of claim 2, further comprising compressing a sample of load plates at a variety of different compressions.

4. The method of claim 3, further comprising testing each of said sample of load plates after compression to determine which compression resulted in a load plate providing said target load.

5. The method of claim 4, further comprising compressing other load plates at said compression which resulted in a load plate providing said target load.

6. The method of claim 3, further comprising repeating said compressing of a sample of load plates at a variety of different compressions for each new run of load plates.

7. The method of claim 1, wherein said compressing further comprises compressing said load plate beyond a compression that would be experienced by said load plate when installed in said ASIC assembly.

8. A method of adjusting a load delivered by a load plate in an Application Specific Integrated Circuit (ASIC) assembly, said method comprising:
   compressing said load plate prior to installing said load plate in said ASIC assembly, said compressing being adjusted to cause said load plate to provide a target load when installed in said ASIC assembly, and
   adjusting a thickness of a load washer based on said target load to be applied by said load plate; and installing the plate in said ASIC assembly.

9. The method of claim 8, further comprising determining said target load.

10. The method of claim 8, further comprising measuring a spring rate of said load plate.

11. The method of claim 10, further comprising selecting said thickness of said load washer in accordance with said target load and said spring rate of said load plate.

12. The method of claim 9, further comprising compressing a sample of load plates at a variety of different compressions.

13. The method of claim 12, further comprising testing each of said sample of load plates after compression to determine which compression resulted in a load plate providing said target load.

14. The method of claim 13, further comprising compressing other load plates at said compression which resulted in a load plate providing said target load.

15. The method of claim 14, further comprising repeating said compressing of a sample of load plates at a variety of different compressions for each new run of load plates.

16. The method of claim 8, further comprising using said load washer to limit deflection of said load plate to control a load applied to said ASIC assembly in accordance with said target load.

17. The method of claim 8, further comprising sandwiching an ASIC and a circuit board between a bolster plate and a load plate, wherein a load screw is driven into said load plate through said washer.

18. The method of claim 8, further comprising plastically deforming said load plate with said compression of said load plate.

19. A method of adjusting a load delivered by a load plate in an Application Specific Integrated Circuit (ASIC) assembly, said method comprising:
   compressing said load plate prior to installing said load plate in said ASIC assembly, said compressing being adjusted to cause said load plate to provide a target load when installed in said ASIC assembly; and
   adjusting a thickness of a load washer based on said target load to be applied by said load plate;
   wherein said compressing further comprises compressing said load plate beyond a compression that would be experienced by said load plate when installed in said ASIC assembly; and installing the plate in said ASIC assembly.

20. A method of sizing a load plate for an Application Specific Integrated Circuit (ASIC) assembly, said method comprising:
forming a load plate with a curvature; and
after forming said load plate, but prior to installing said load plate in said ASIC assembly, compressing said load plate, said compressing causing said load plate to plastically deform; and installing the plate in said ASIC assembly.

21. The method of claim 20, wherein said compressing further, comprises compressing said load plate beyond a compression that would be experienced by said load plate when installed in said ASIC assembly.

22. The method of claim 20, wherein said compressing said load plate to plastically deform said load plate is adjusted such that said load plate will provide a target load when installed in said ASIC assembly.

* * * * *

UNITED STATES PATENT AND TRADEMARK OFFICE
CERTIFICATE OF CORRECTION

PATENT NO. : 7,323,358 B1 Page 1 of 1
APPLICATION NO. : 10/639853
DATED : January 29, 2008
INVENTOR(S) : Stephen Daniel Cromwell It is certified that error appears in the above-identified patent and that said Letters Patent is hereby corrected as shown below:

On the face page, in field (56), under "U.S. Patent Documents", in column 2, line 16, delete "2003/0224557" and insert -- 2003/00224558 --, therefor.

In column 6, line 21, in Claim 8, after "assembly" delete "," and insert -- ; --, therefor.

In column 6, line 27, in Claim 10, after "claim" delete "8" and insert -- 9 --, therefor.

In column 8, line 2, in Claim 21, after "further" delete ",".

Signed and Sealed this

Seventeenth Day of June, 2008

JON W. DUDAS
*Director of the United States Patent and Trademark Office*